United States Patent
Honda et al.

(10) Patent No.: US 7,638,769 B2
(45) Date of Patent: Dec. 29, 2009

(54) SOLID-STATE IMAGE SENSING DEVICE, METHOD FOR MANUFACTURING THE SAME, AND IMAGING SYSTEM

(75) Inventors: Hiroto Honda, Tokyo (JP); Ikuo Fujiwara, Yokohama (JP); Yoshinori Iida, Tokyo (JP); Naru Ikeda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 121 days.

(21) Appl. No.: 11/828,614

(22) Filed: Jul. 26, 2007

(65) Prior Publication Data
US 2008/0035847 A1 Feb. 14, 2008

(30) Foreign Application Priority Data
Aug. 9, 2006 (JP) ............................ 2006-217216

(51) Int. Cl.
*G01J 5/20* (2006.01)
*G02F 1/01* (2006.01)
*G01J 5/02* (2006.01)
*H01Q 1/38* (2006.01)

(52) U.S. Cl. ................. 250/338.4; 250/330; 250/341.8; 343/700 MS; 343/703

(58) Field of Classification Search ................. 250/332, 250/338.1, 338.2, 338.3, 338.4, 338.5, 330, 250/390.01, 341.8; 343/700 MS, 703
See application file for complete search history.

(56) References Cited

U.S. PATENT DOCUMENTS 5,696,372 A * 12/1997 Grober et al. ............... 250/216
6,242,740 B1 6/2001 Luukanen et al.
6,292,140 B1 * 9/2001 Osterman ............ 343/700 MS
6,329,655 B1 12/2001 Jack et al.

(Continued)

FOREIGN PATENT DOCUMENTS

JP 2001-281065 10/2001

(Continued)

OTHER PUBLICATIONS

Tomohiro Ishikawa, et al., "Low-cost 320×240 uncooled IRFPA using conventional silicon IC process." Proceedings of SPIE vol. 3698, Apr. 1999, pp. 556-564.

*Primary Examiner*—David P Porta
*Assistant Examiner*—Faye Boosalis
(74) *Attorney, Agent, or Firm*—Oblon, Spivak, McClelland, Maier & Neustadt, L.L.P.

(57) ABSTRACT

The present invention provides a solid-state image sensing device that converts long-wavelength light represented by the terahertz band into electric signals without being affected by the fluctuation of radiated heat, and outputs the signals mainly as picture signals; a method for manufacturing the same, and an imaging system. The cell unit has an antenna to generate electrical signals by receiving incident electric waves, an electrical resistor electrically connected to the antenna, and to vary the temperature of the cell unit by generating Joule heat corresponding to the electrical signals, and a thermoelectric conversion element electrically connected to the support structure portion, electrically insulated from the antenna and the electrical resistor, and thermally connected to the electrical resistor, to generate electrical signals by detecting the temperature variation of the cell unit; and the side of the incident electric waves in the cell unit is formed of a material to reflect infrared lights.

16 Claims, 16 Drawing Sheets

U.S. PATENT DOCUMENTS

| | | |
|---|---|---|
| 6,441,368 B1 | 8/2002 | Grinberg et al. |
| 6,541,298 B2 | 4/2003 | Iida et al. |
| 6,573,504 B2 | 6/2003 | Iida et al. |
| 6,770,881 B2 | 8/2004 | Iida et al. |
| 6,985,116 B2 | 1/2006 | Agnese et al. |
| 7,132,655 B2 * | 11/2006 | Jack et al. ............ 250/338.1 |
| 2007/0170361 A1 | 7/2007 | Honda et al. |

FOREIGN PATENT DOCUMENTS

| | | |
|---|---|---|
| JP | 2004-354380 | 12/2004 |

* cited by examiner

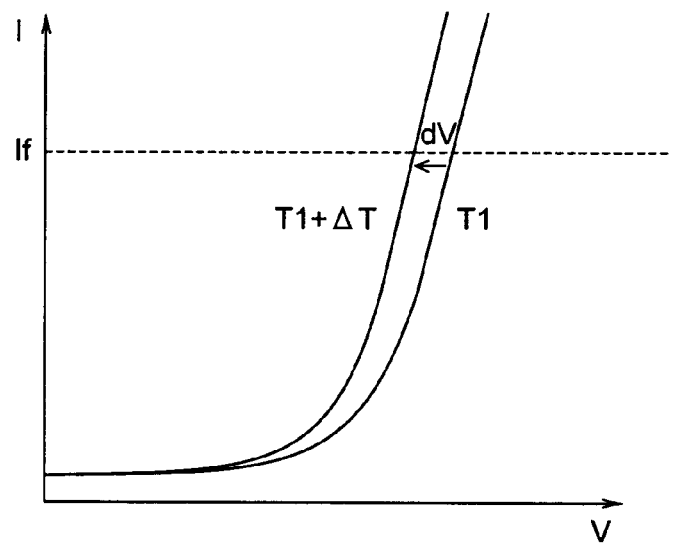
FIG. 3
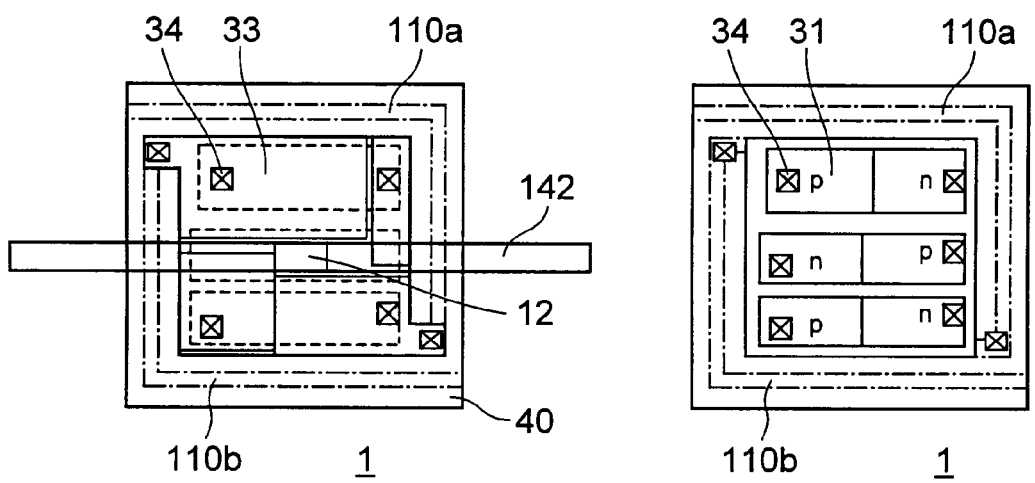
FIG. 4A
FIG. 4B

SOLID-STATE IMAGE SENSING DEVICE, METHOD FOR MANUFACTURING THE SAME, AND IMAGING SYSTEM

CROSS-REFERENCE TO RELATED APPLICATION

This application is based upon and claims the benefit of priority from prior Japanese Patent Application No. 2006-217216 filed on Aug. 9, 2006 in Japan, the entire contents of which are incorporated herein by reference.

BACKGROUND OF THE INVENTION

1. Field of the Invention

The present invention relates to a solid-state image sensing device for images of long-wavelength light represented by the terahertz band, and specifically to a solid-state image sensing device having high sensitivity and high resolution, a method for the fabrication thereof, and an imaging system.

2. Related Art

There has been an infrared sensor that absorbs incident far-infrared lights (of a wavelength of 8 μm to 12 μm) in a cell unit to once convert into heat energy, which is in turn converted into electric signals by a thermoelectric conversion element provided in the cell unit (for example, refer to JP-A 2001-281065 (KOKAI)). However, by this configuration, frequency bands that spans between 100 GHz and 10 THz (wavelengths of 30 μm and 3 mm) having wavelengths longer than far-infrared lights and the characteristics of both electric wave and light, i.e., high-frequency long-wavelength electromagnetic waves represented by the terahertz band cannot be detected.

U.S. Pat. No. 6,441,368 adopts a system wherein an antenna structure is installed on an infrared sensor to receive electromagnetic waves of millimeter waveband from 30 GHz to 1 THz, and heat generated in the antenna is converted into electric signals by a thermoelectric conversion element. For the antenna structure, a protective pad is provided in the location facing the direction of incident electromagnetic waves, and thereby, the incidence of infrared lights (of a wavelength from about 1 μm to 30 m) having a higher frequency (shorter wavelength) than the above-described wavelength band into the detected cell is prevented. This is because the electromagnetic waves of the infrared band, which are constantly radiated from substances at normal temperature has an extremely high power compared with the power of the electromagnetic waves of the above-described millimeter waveband, and since the amount of radiation energy fluctuates, the electromagnetic waves of the infrared band must be blocked to constitute a detecting element specialized for millimeter waveband or terahertz band.

However, the protective pad structure disclosed in U.S. Pat. No. 6,441,368 has essential defects that: (1) the radiation from the protective pad itself cannot be ignored; (2) the protective pat absorbs millimeter waves or terahertz waves to be detected; and (3) capacity coupling occurs between the protective pad and the antenna structure to deteriorate antenna characteristics.

SUMMARY OF THE INVENTION

The present invention provides a solid-state image sensing device that converts long-wavelength light represented by the terahertz band into electric signals without being affected by the fluctuation of radiated heat, and outputs the signals mainly as picture signals; a method for the fabrication thereof, and an imaging system.

A solid-state image sensing device according to a first aspect of the present invention includes: a semiconductor substrate having a recess formed in the surface portion thereof; a readout wiring portion provided on the semiconductor substrate; a support structure portion disposed above the recess, and having a connecting wiring electrically connected to the readout wiring portion; and a cell unit disposed above the recess, and supported by the support structure portion, the cell unit including: an antenna to generate electrical signals by receiving incident electric waves; an electrical resistor electrically connected to the antenna, and to vary the temperature of the cell unit by generating Joule heat corresponding to the electrical signals; a thermoelectric conversion element electrically connected to the support structure portion, electrically insulated from the antenna and the electrical resistor, and thermally connected to the electrical resistor, to generate electrical signals by detecting the temperature variation of the cell unit; and a member to reflect infrared lights provided on the incident side of the electric waves in the cell unit.

A imaging system according to a second aspect of the present invention includes: a semiconductor substrate having a recess formed in a surface portion thereof; a plurality of solid-state image sensing devices disposed in a matrix form on the semiconductor substrate as a pixel array, each of the solid-state image sensing devices including: a readout wiring portion provided on the semiconductor substrate; a support structure portion disposed above the recess, and having a connecting wiring electrically connected to the readout wiring portion, and a cell unit disposed above the recess, and supported by the support structure portion, the cell unit including: an antenna to generate electrical signals by receiving incident electric waves, an electrical resistor electrically connected to the antenna, and to vary the temperature of the cell unit by generating Joule heat corresponding to the electrical signals, a thermoelectric conversion element electrically connected to the support structure portion, electrically insulated from the antenna and the electrical resistor, and thermally connected to the electrical resistor, to generate electrical signals by detecting the temperature variation of the cell unit, and a member to reflect infrared lights provided on the incident side of the electric waves in the cell unit; and a readout circuit that sequentially reads out the electrical signals sensed by each of the solid-state image sensing devices as picture signals.

A method for manufacturing a solid-state image sensing device according to a third aspect of the present invention includes: forming a thermoelectric conversion element, a first wiring portion electrically connected to the thermoelectric conversion element, a second wiring portion electrically connected to the first wiring portion, a third wiring portion electrically connected to the second wiring portion, and an insulating film that covers the thermoelectric conversion element and the first to third wiring portions; patterning the insulating film and forming in the insulating film a first opening to expose the semiconductor substrate on the bottom, to form a first portion composed of the thermoelectric conversion element and the insulating film that covers the thermoelectric conversion element, a second portion composed of the second wiring portion and the insulating film that covers the second wiring portion, and a third portion composed of the third wiring portion and the insulating film that covers the third wiring portion, each isolated by the first opening; etching a part of the insulating film on the second portion; forming a sacrifice layer on the semiconductor substrate so as to bury the first opening; forming a second opening in the sacrifice layer to expose the surface of the insulating film in the first portion in the bottom; forming an electrical resistor film on the insulating film in the second opening, and patterning the electrical resistor film to form an electrical resistor; forming an antenna supporting film on the sacrifice layer so as to bury the second opening; forming a contact hole that opens into the electrical resistor in the antenna supporting film; burying the contact hole with a conductor to form a contact; forming a metal film so as to cover the antenna supporting film and the contact; forming a protective film on the metal film; patterning the protective film, the metal film and the antenna supporting film to form an antenna composed of the metal film, and to simultaneously expose the surface of the sacrifice layer; removing the sacrifice layer by etching to form a recess on the surface portion of the semiconductor substrate situated below the thermoelectric conversion element; and removing the protective layer.

BRIEF DESCRIPTION OF THE DRAWINGS

FIG. 3 is a graph showing the relationship between the forward voltage and the current of a p-n junction diode;

FIGS. 4A and 4B are diagrams showing the arrangement of a p-n junction diode against the pattern of a dipole antenna, and an example of the arrangement of wiring layers, respectively;

DETAILED DESCRIPTION OF THE INVENTION

Figure 1:
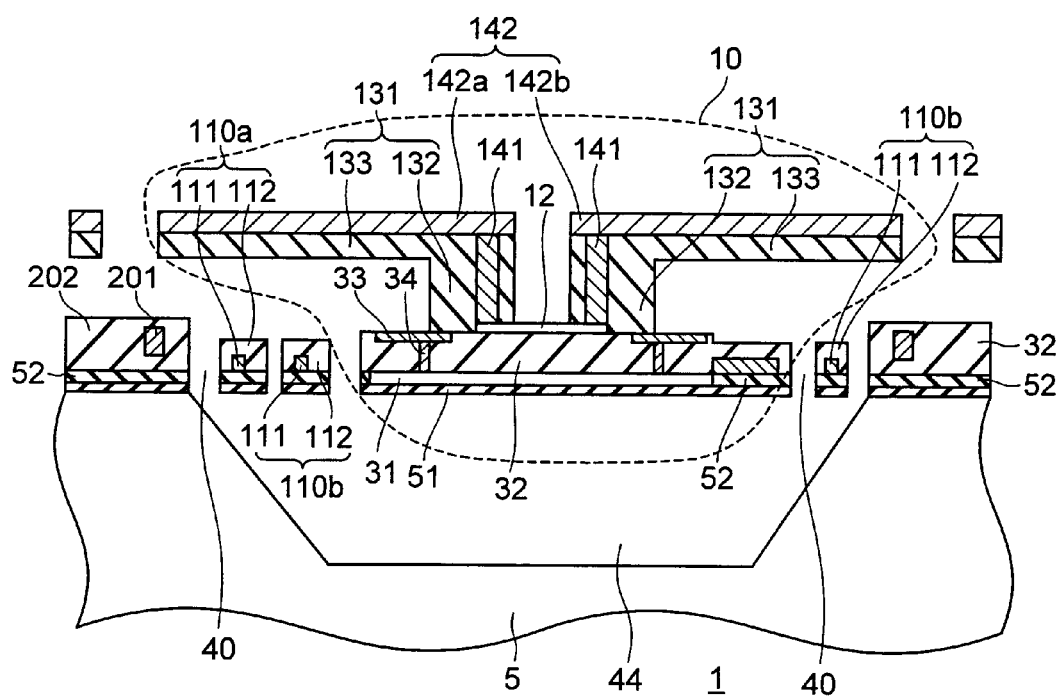
FIG. 1 is a sectional view of a solid-state image sensing device according to an embodiment of the present invention.

An embodiment of the present invention will be described below referring to the drawings.

Figure 2A:
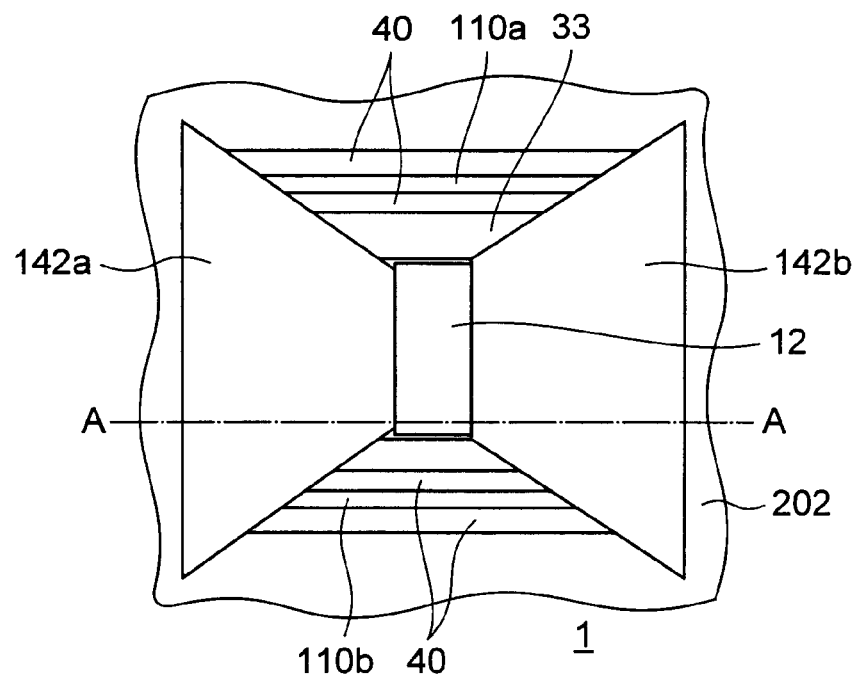
FIG. 2A is a top view of the cell unit of the solid-state image sensing device shown in FIG. 1.
Figure 2B:
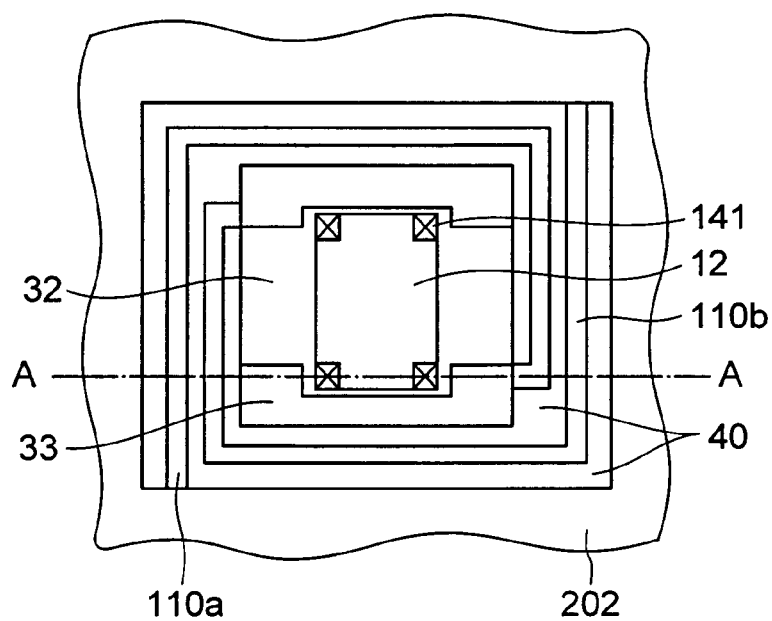
FIG. 2B is a plan view of the cell unit when the antenna and the antenna supporting film have been removed.

The configuration of a solid-state image sensing device 1 according to an embodiment of the present invention is shown in FIGS. 1 to 2B. FIG. 1 is a sectional view of a solid-state image sensing device 1 according to the present embodiment; FIG. 2A is a top view of the cell unit 10 of the solid-state image sensing device 1 shown in FIG. 1; and FIG. 2B is a plan view of the cell unit 10 when the antenna 142 and the antenna supporting film 131 which will be described later have been removed. FIG. 1 shows a vertical sectional view when the solid-state image sensing device 1 is cut along line A-A shown in FIG. 2A. The solid-state image sensing device 1 forms a detector (i.e., a pixel).

The solid-state image sensing device 1 of the present embodiment is formed on an SOI (silicon on insulator) substrate composed of a supporting substrate 5, a buried oxide film 51 and an SOI layer. A thermoelectric conversion element 31 described below is formed on the SOI layer, and the SOI layer on which the thermoelectric conversion element 31 is not formed is replaced by an element isolation 52 composed, for example, of silicon dioxide. A hollow portion (recess) 44 is provided in the buried oxide film 51 side of the supporting substrate 5, and a cell unit 10 is provided on the buried oxide film 51 and the element isolation 52 over the hollow portion 44. The cell unit 10 is equipped with a resistor 12, a thermoelectric conversion element 31, an insulating film 32, wiring layers 33, contacts 34, antenna supporting films 131, contacts 141, and an antenna 142. The insulating film 32 is formed so as to cover the thermoelectric conversion element 31 and the element isolation 52, and a resistor 12 is provided on the upper surface of the center of the insulating film 32. The planar shape of the resistor 12 is, for example, rectangular. Wiring layers 33 are provided on the upper surface of the insulating film 32 so as not to intersect the resistor 12, and contacts 34 for electrically connecting the wiring layers 33 to the thermoelectric conversion element 31 are provided in the insulating film 32.

A pair of antenna supporting films 131 is formed so as to cover facing sides in parallel to the lengthwise direction of the resistor 12. The resistor 12 between the antenna supporting films 131 has its surface exposed. The antenna supporting films 131 are equipped with support portions 132 extending in the direction substantially perpendicular to the insulating film 32, and antenna supporting portions 133 extending from the upper side of one support portion 132 to the opposite side to the other support portion 132. An antenna 142 composed of first and second antenna portions 142a and 142b is provided on the upper surfaces of these antenna supporting films 131. Specifically, the first antenna portion 142a is provided on the upper surface of one of a pair of antenna supporting films 131, and the second antenna portion 142b is provided on the upper surface of the other antenna supporting films 131. Each of the first and second antenna portions 142a and 142b has a planar shape becoming wider as parting from the support portion 132, as shown in FIG. 2A. Contacts 141 for electrically connecting the resistor 12 to the first and second antenna portions 142a and 142b are provided on the support portions 132.

The cell unit 10 is supported by a support structure 110 formed over the hollow portion 44 around the cell unit 10. The support structure 110 has a first support 110a and second supports 110b disposed around the insulating film 32 in the cell unit 10 so as not to intersect with each other. Between the insulating film 32, the first support 110a and the second supports 110b, openings 40 connected to the hollow portion 44 are provided. Each of the first support 110a and second supports 110b is equipped with a protective film 112 formed on the element isolation 52 and a connecting wiring 111 formed in the protective film 112. As FIG. 2B shows, an end of each of the first support 110a and second supports 110b is connected to the insulating film 32, and the other end is connected to a protective film 202 described later. An end of the connecting wiring 111 of each of the first support 110a and second supports 110b is electrically connected to a wiring 33 via a contact (not shown) provided in the insulating film 32, and the other end is electrically connected to the readout wiring 202 described later. Therefore, an end of the connecting wiring 111 is electrically connected to the thermoelectric conversion element via the contact, the wiring 33 and the contact 34. A protective film 202 is provided on the element isolation 52 excluding the region where the hollow portion 44 is formed, and a readout wiring 201 is formed in the protective film 202.

The antenna 142 is formed of a metal film having a very low electrical resistance, and receives incident electric waves. The resistance of the antenna 142 is preferably low, for example, 10Ω or lower. Further, the length of the antenna 142, that is the average of the length of the long side and the length of the diagonal of a rectangle inscribed in the planar shape of the antenna 142 is preferably about ½ the wavelength of incident electric waves, and thereby, the electric waves having the above-described wavelength can be selectively received.

As described above, the first and second antenna portions 142a and 142b of the antenna 142 are electrically connected to a resistor (electrical resistor) 12 via the contacts 141. Here, the contacts 141 have preferably a low resistance of 10Ω or lower, in the same manner as the antenna 142. The resistance of the resistor 12 is, for example, about 200Ω.

Electric waves received by the antenna 142 generate electric current (i.e., electric signals) between the antenna 142, the contacts 141 and the resistor 12. The frequency of the current equals to the frequency of the received electric waves. The electromagnetic waves having a long wavelength, represented by the terahertz band, to be processed by the solid-state image sensing device 1 according to the present embodiment, specifically the electromagnetic waves of a frequency band from 100 GHz to 10 THz (wavelength from 30 µm to 3 mm) has a very high frequency, and it is difficult to electrically process such electromagnetic waves. Therefore, Joule heat generated by the above-described generated current in the resistor 12 is utilized. The Joule heat "Pa" (W), the generated current "Ia" (A), and the resistance of the resistor 12 "Ra" (Ω) are given by the following equation:

$$P_a = I_a^2 R_a \quad (1)$$

The Joule heat Pa generated here elevates the temperature of the cell unit 10. As described above, since the solid-state image sensing device 1 is installed in a vacuum, and the cell unit 10 is supported by the support structure 110 on the hollow portion 44 fabricated by etching the SOI substrate 5, it is thermally isolated from the SOI substrate 5.

In this structure, the connecting wirings 111 and the protective films 112 of the first and second supports 110a and 110b composing the support structure 110 to support the cell unit 10 are connected to the readout wiring 201 and the readout wiring protective film 202, respectively, and surround the portion of the cell unit 10 of the same height. The connecting wirings 111 are electrically connected to the readout wiring 201. The heat isolation of the cell unit 10 is determined by the thermal conductance of the first and second supports 110a and 110b, and by lengthening and narrowing the first and second supports 110a and 110b, the thermal insulation performance thereof is improved.

When the thermal conductance of the entire support structure 110 is "$G_{th}$", the temperature elevation ΔT of the cell unit 10 due to thermal energy "Pa" generated as described above is given by the following equation:

$$\Delta T = \frac{P_a}{G_{th}} \{1 - \exp(-tG_{th}/C_{th})\} \quad (2)$$

where "t" is the time elapsed from the start of receiving electromagnetic waves, and "$C_{th}$" is the thermal capacity of the cell unit 10.

When the antenna 142 receives constant electric waves, the temperature of the cell unit 10 is in a steady state at a thermal time constant of τ. The thermal time constant τ is calculated by the following equation.

$$\tau = C_{th}/G_{th} \quad (3)$$

When the size of the cell unit 10 is about 30 µm×30 µm, the height thereof is about 4 µm to 5 µm, the cross-sectional size of the protective film 112 of the first and second supports 110a and 110b is about 1 µm×1 µm, and the length from the cell unit 10 to the protective film 202 is about 70 µm, the thermal time constant is about 20 msec to 50 msec.

At the steady state, the temperature elevation ΔT of the cell unit 10 approximates the value of:

$$\Delta T = \frac{P_a}{G_{th}} \quad (4)$$

As known from Equation 4, what determines the cell unit 10 at the steady state are only the energy amount of generated Joule heat and the thermal conductance of the support structure 110.

The temperature elevation ΔT of the cell unit 10 is detected by the thermoelectric conversion element 31 formed under the cell unit 10. For example, a method is convenient wherein a constant current is flowed in the thermoelectric conversion element 31 via the readout wiring 20 and the connecting wirings 111, and in this state, change in voltages (i.e., potential difference) between the both ends of the thermoelectric conversion element 31 is measured.

In this method, the thermoelectric conversion ratio is represented by dV/dT, and voltage change dV is caused by the temperature elevation ΔT of the cell unit 10. Therefore in the steady state, a voltage signal (electric signal) represented by the equation:

$$dV = \Delta T \cdot \frac{dV}{dT} = \frac{P_a}{G_{th}} \frac{dV}{dT} \quad (5)$$

is outputted from the cell unit 10.

The thermoelectric conversion element 31 is electrically connected to the connecting wirings 111, electrically insulated from the antenna 142 and the resistor 12, and also thermally connected to the antenna 142 and the resistor 12; and detects the temperature change in the cell unit 10 to generate electric signals.

Meanwhile, the energy density of radiation of light having a wavelength of about 10 µm is about 1,000 times higher than the energy density of radiation of light having a wavelength of about 100 µm (terahertz beams). Consequently, a thermal sensor wherein a solid-state image sensing device 1 like the present embodiment is formed is significantly affected by noise particularly due to the fluctuation of radiant heat at a wavelength of about 10 µm.

In the solid-state image sensing device 1, an insulating film 32 composed of silicon dioxide is formed between the resistor 12 and the thermoelectric conversion element 31, and antenna support film 131 composed of silicon nitride is formed under the antenna 142. The insulating film 32 is formed so as to have a thickness (i.e., the distance from the upper surface of the thermoelectric conversion element 31 to the lower surface of the resistor 12) of 1 to 1.5 μm.

As described above, if a material having an absorption peak in the vicinity of 10 μm, such as silicon dioxide and silicon nitride, is formed on the surface of the solid-state image sensing device 1, the temperature elevation of the cell unit 10 due to the radiation of light of the 10 μm band in such a material controls the signal components.

Therefore, for the solid-state image sensing device 1 of the present embodiment, a material that reflects light of the 10 μm band must be exposed on the surface, and for this purpose, in the solid-state image sensing device 1 of the present embodiment, the antenna 142 is exposed to the incidental electric wave side.

A gap is formed between the first and second antenna portions 142a and 142b composing the antenna 142. In the present embodiment, to reflect the light of the 10 μm band passing through the gap, wiring layers 33 are formed as metal films so as to cover the insulating film 32 located in the gap, and the wiring layers 33 are exposed. The wiring layers 33 are electrically connected to the thermoelectric conversion element 31 via the contacts 34. In addition to these wiring layers 33, dummy wiring layers not connected to the thermoelectric conversion element 31 via the contacts can be formed of the same material as the wiring layers 33 on the insulating film 32 to reflect the light of the 10 μm band.

According to the above-described method, when viewed from the electric-wave incidence plane, the entire cell unit 10 can be covered by a metal region to reflect the light of the 10 μm band (i.e., the antenna 142, the resistor 12 and the wiring layers 33). For example, the protective film 112 and the like other than the cell unit 10 can absorb the light of the 10 μm band.

Thereby, the image of long-wavelength light can be converted to electric signals at high sensitivity without cooling and without being affected by the fluctuation of radiated heat of the 10 μm band, and can be outputted as picture or moving images.

In the present embodiment, the thermoelectric conversion element 31 is composed of p-n junction diodes formed by ion implantation into the SOI layer. The forward voltage of the p-n junction diode is lowered with temperature elevation in the state wherein a constant current "If" is flowed, as shown in FIG. 3.

Since the thermoelectric conversion factor dV/dT increases in proportion to the number of serially connected p-n junction diodes under a constant current, it is preferable that a large number of the p-n junction diodes are serially composed in the cell unit 10.

Figure 5:
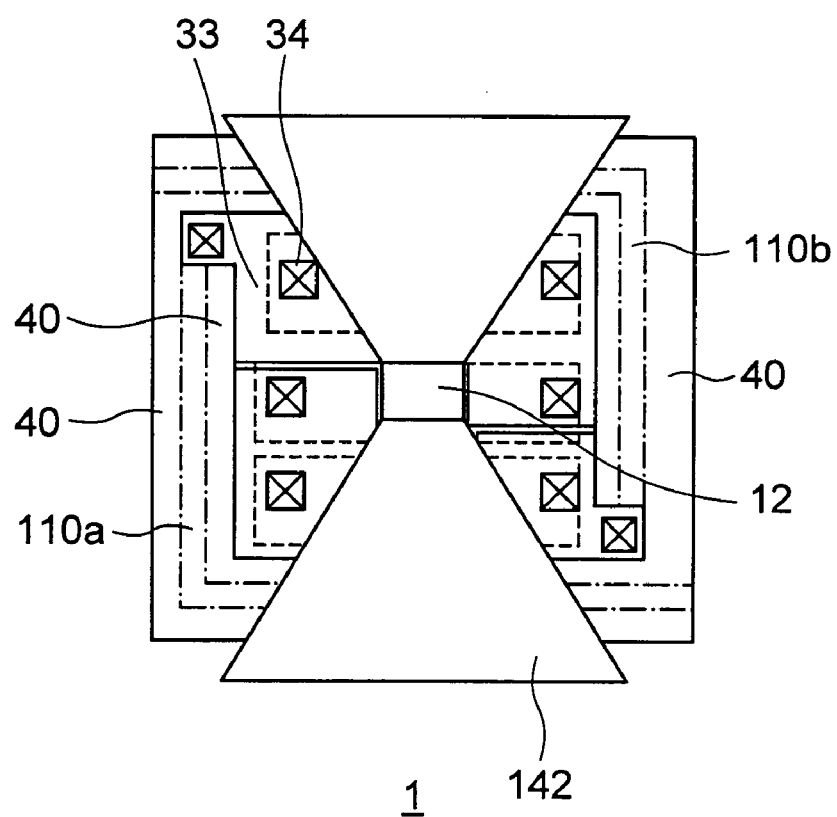
FIG. 5 is a diagram showing the arrangement of a p-n junction diode against the pattern of a bow-tie antenna, and an example of the arrangement of wiring layers.

Here, FIGS. 4A and 4B show the arrangement of p-n junction diodes against the pattern of a dipole antenna, and an example of the arrangement of wiring layers, respectively; and FIG. 5 shows the arrangement of p-n junction diodes against the pattern of a bow-tie antenna, and an example of the arrangement of wiring layers.

FIG. 4A shows a configuration wherein three p-n junction diodes are serially formed in the cell unit 10. Although a larger number of p-n junction diodes can be actually formed, it is not essential, and in the present embodiment, three p-n junction diodes are shown for the ease of understanding.

FIG. 4A also shows examples of the arrangement of p-n junction diodes and wiring layers 33 when a dipole antenna is constituted. In this configuration, electric waves having a wavelength twice the length of the dipole antenna can be selectively received. In FIG. 4A, since the ratio occupied by the insulating film 32 is high when viewed from the above, the connecting wiring between p-n junction diodes is extended to cover the entire insulating film 32. The contact of the thermoelectric conversion element positioned below the antenna 142 is not shown in the drawing.

FIG. 4B is a plan view when a part deeper than the lower surface of the wiring layers 33 shown in FIG. 4A (i.e., a part close to the semiconductor substrate 5) is viewed.

FIG. 5 shows the arrangement of a p-n junction diode against the pattern of a bow-tie antenna, and an example of the arrangement of wiring layers 33 for the thermoelectric conversion element. The bow-tie antenna is characterized in that the band width of received electric waves is wider than in a dipole antenna. In the configuration shown in FIG. 5, the wiring layers 33 can be constituted so as to cover the exposed insulating film 32 when vied from the upper surface.

Figure 6:
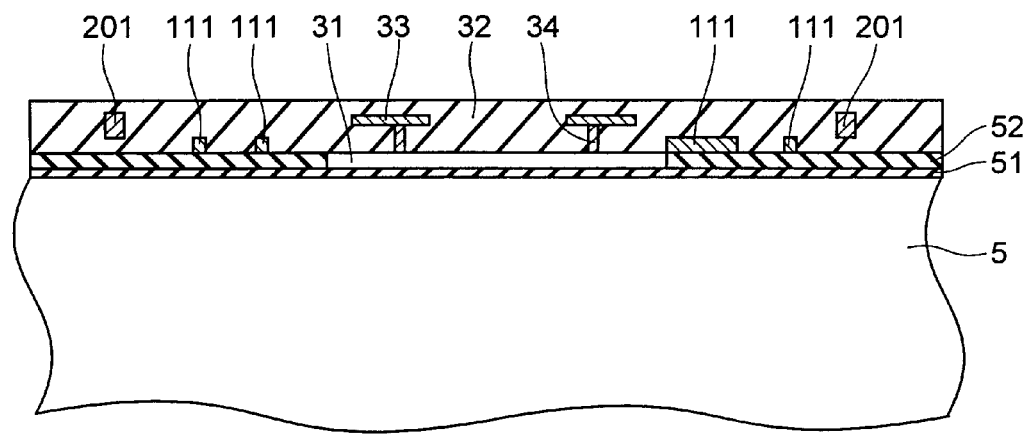
FIGS. 6 to 17 are sectional views showing an example of a method for manufacturing a solid-state image sensing device according to an embodiment of the present invention.

Next, an example of methods for manufacturing a solid-state image sensing device 1 according to the present embodiment will be described referring to FIGS. 6 to 17. First, as FIG. 6 shows, an SOI substrate is prepared. The SOI substrate is composed of a supporting substrate 5, a buried oxide film 51 and an SOI layer. In the present embodiment, a thermoelectric conversion element 31 is formed in the SOI layer. The area of the SOI layer other than the area wherein the thermoelectric conversion element 31 is formed is replaced by element isolation 52 composed of silicon dioxide. Above the thermoelectric conversion element 31 and element isolation 52, connecting wirings 111 composed, for example, of impurity-introduced polycrystalline silicon, wiring layers 33 composed of a metal, contacts 34, readout wirings 201 composed, for example, of a metal, and an insulating film 32 that covers them are formed using a well known technique. To this fabricating method, a normal CMOS-LSI fabricating process can be applied, and at the same time of forming the above-described structure, a processing circuit consisting of transistors, capacitors and the like can be formed.

Figure 7:
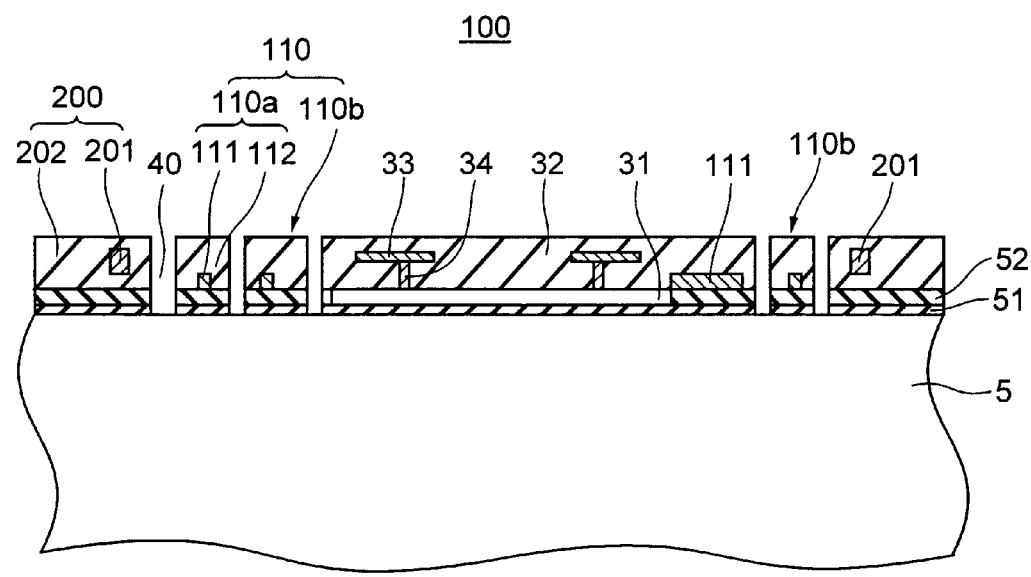

Next, as FIG. 7 shows, openings 40 wherein the supporting substrate 5 is exposed on the bottoms are formed using RIE (reactive ion etching) in the laminated film consisting of the insulating film 32, the SOI layer 52 and the buried oxide film 51. Thereby, the bottom 100 of the cell unit 10, the supporting structure 110 composed of the first and second supporting portions 110a and 110b, and the peripheral portions 200 are isolated.

Figure 8:
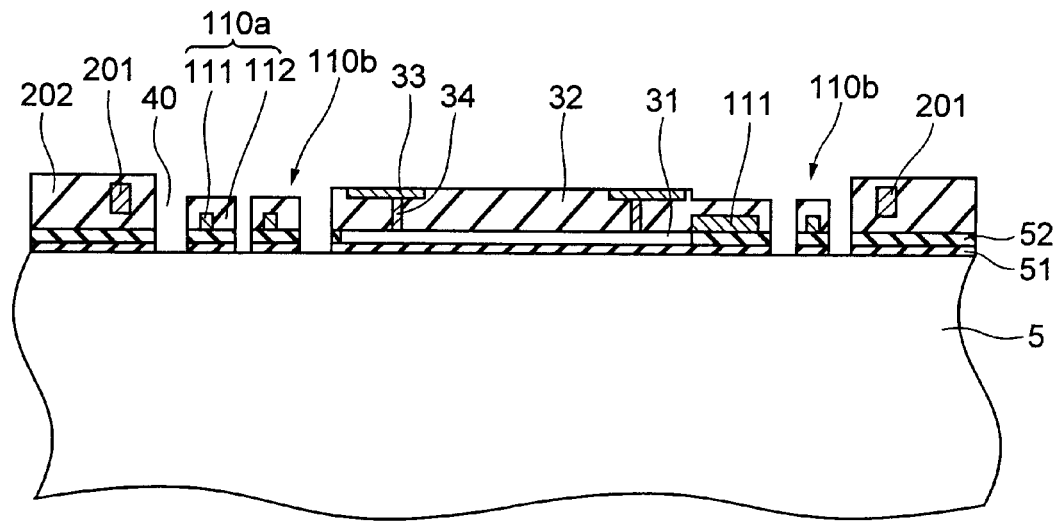

Furthermore, by forming a mask material (not shown) only on the peripheral portions 200, and etching using the mask material, the protective film 112 of the supporting structure 110 and the insulating film 32 of the cell unit 10 are etched as shown in FIG. 8. The wiring layers 33 are etched so that a thin insulating film 32 is left on the upper surface of the wiring layers 33 (not shown). Here, the thickness of the insulating film 32 left on the wiring layers 33 is about 0.1 μm to 0.3 μm. By thus leaving a thin insulating film 32, in the step for removing a sacrifice layer 41 described below and a part of the semiconductor substrate 5 (FIG. 17), the exposure of the wiring layers 33 to etching can be prevented, and the thinning or loss thereof can be prevented. The insulating film 32 is not necessarily left on the wiring layers 33 under design conditions wherein film thinning due to etching can be neglected, and in this case, the upper surfaces of the wiring layers 33 are exposed by the etching.

Figure 9:
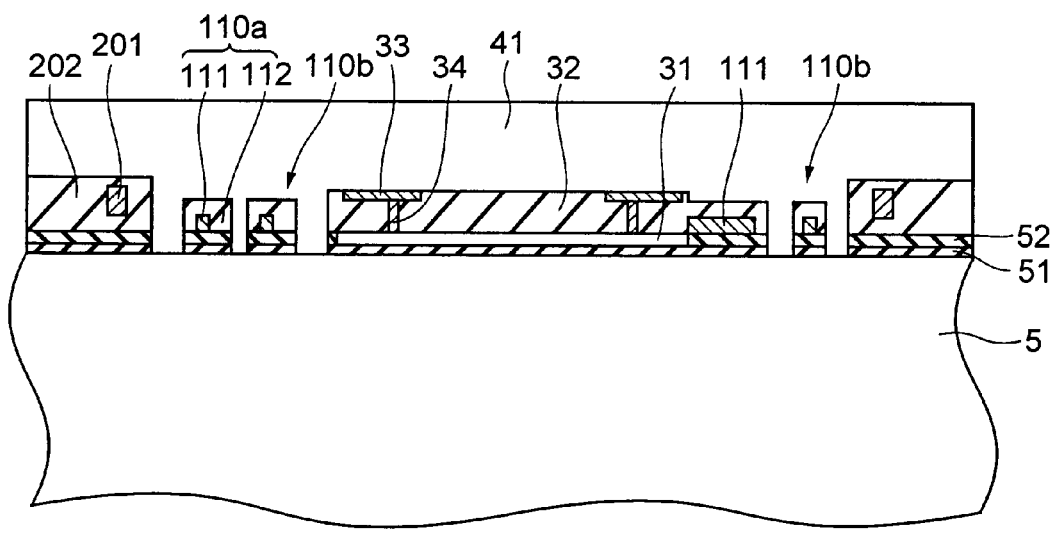
Figure 10:
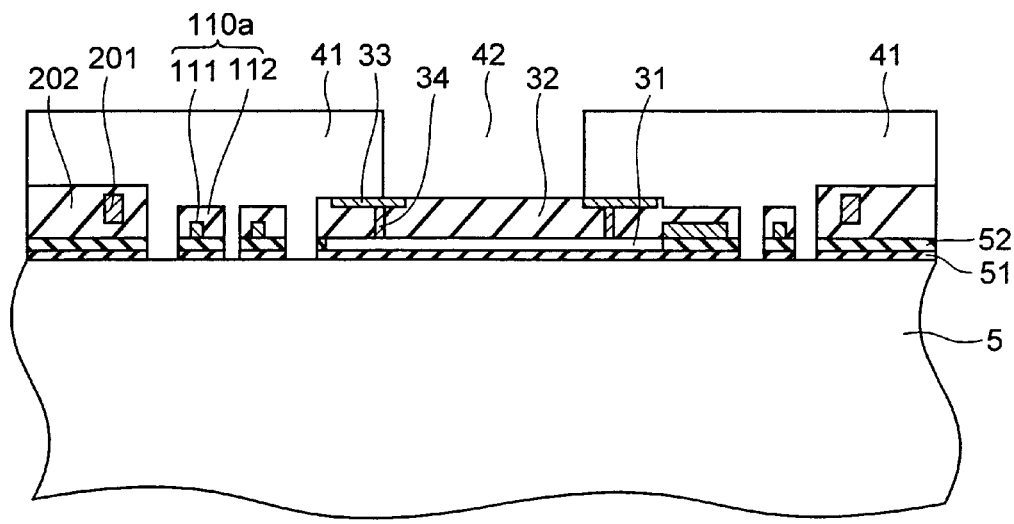
Figure 11:
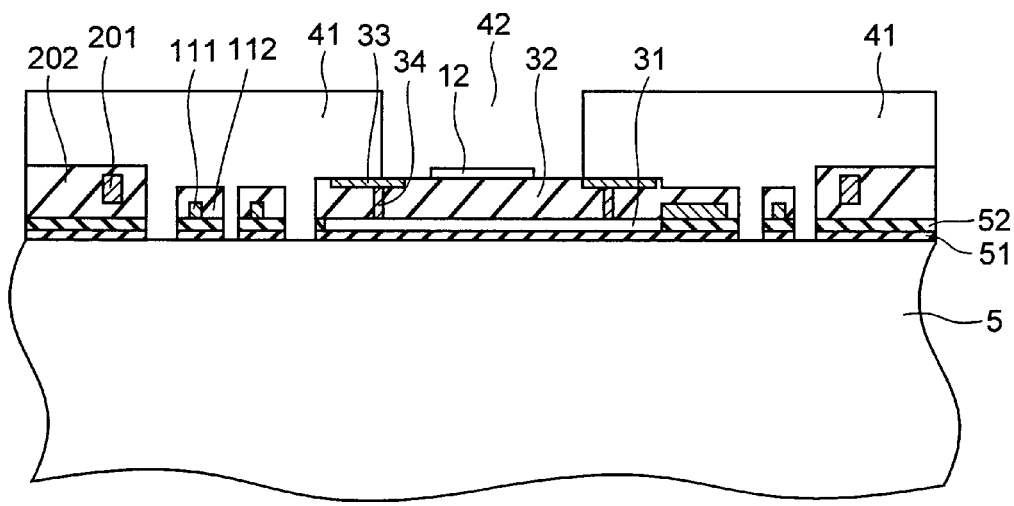

After the mask material has been removed, as FIG. 9 shows, a sacrifice layer 41 composed, for example, of amorphous silicon is formed on the entire surface for forming an antenna. The sacrifice layer 41 is preferably constituted so as to have a thickness, for example, of 3 μm so that the contact of the antenna 142 to the protective film 202 (sticking) is difficult to occur in the release shown in FIG. 17. Then, as FIG. 10 shows, an opening 42 wherein the insulating film 32 is exposed on the bottom is formed in the sacrifice layer 41, and as FIG. 11 shows, a resistor 12 is formed on the bottom of the opening 42 and patterned so as to leave the resistor 12 in the center of the opening 42.

Figure 12:
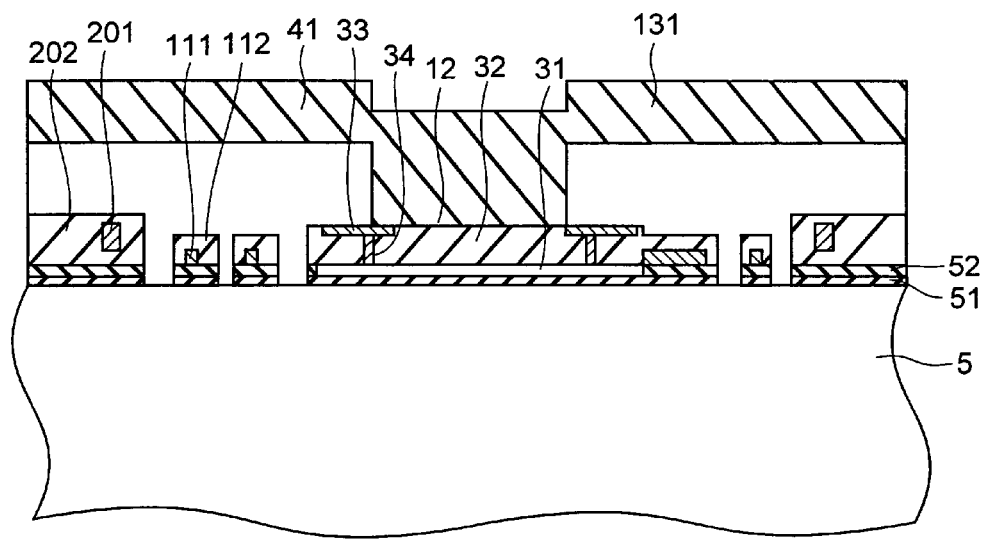
Figure 13:
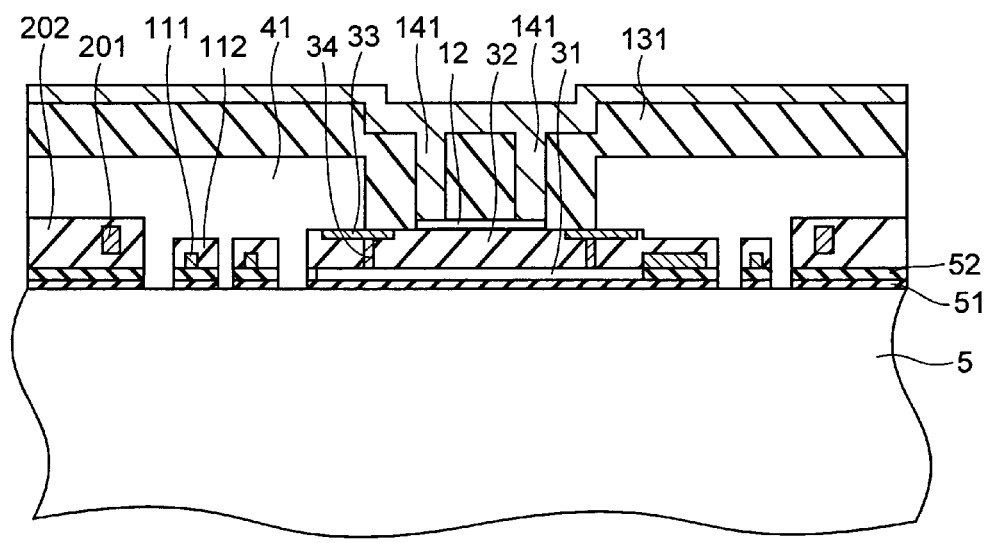
Figure 14:
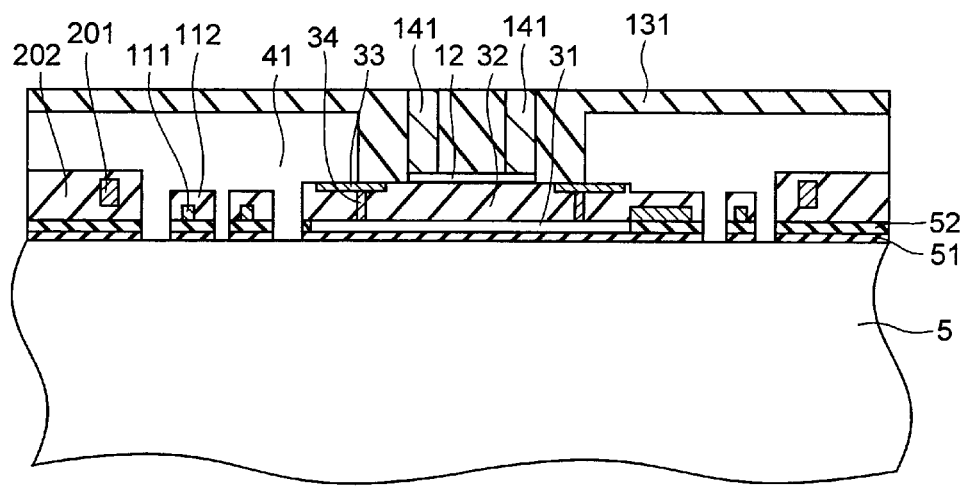

Next, as FIG. 12 shows, an antenna supporting film 131 composed, for example, of silicon nitride is formed so as to cover the opening 42. Then, as FIG. 13 shows, contact holes to the resistor 12 are formed in the antenna supporting film 131, and the contact holes are buried with a semiconductor film, for example, an Al film 141. Then, as FIG. 14 shows, the excessive Al film 141 is removed and the remaining Al film 141 is planarized using, for example, CMP (chemical mechanical polishing) to form contacts 141 composed of Al.

Figure 15:
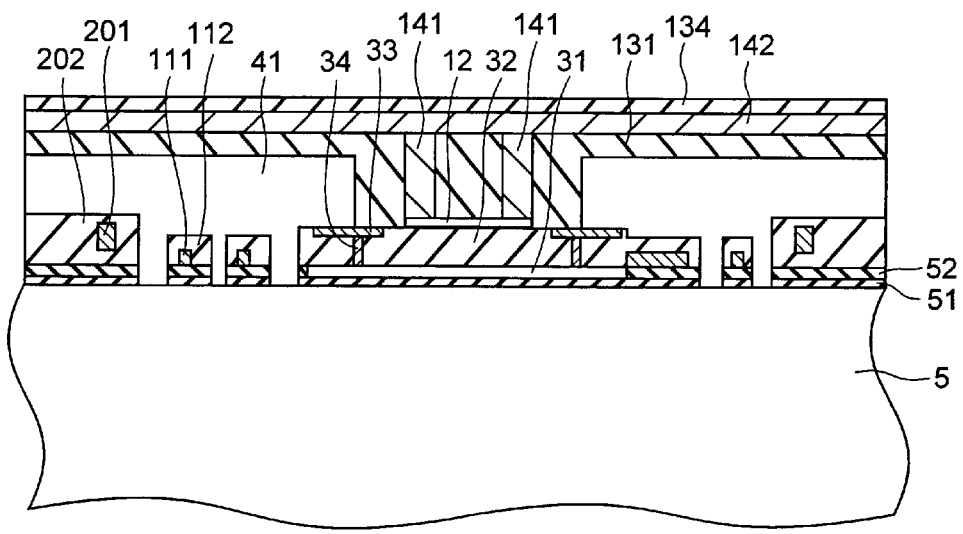

Then, as FIG. 15 shows, an antenna 142 and an antenna protective film 134 are formed. The antenna 142 is composed of a low-resistance metal film, such as Al. The antenna protective film 134 is preferably composed of silicon dioxide, and the antenna supporting film 131 is preferably composed of silicon nitride. This is because only the upper surface of the antenna 142 is exposed while protecting the antenna 142 from the subsequent steps for etching silicon and silicon dioxide. The antenna protective film 134 is formed so as to have a thickness substantially identical to the thickness of the insulating film 32 remaining on the wiring layers 33.

The antenna 142 can be simultaneously formed with the contacts 141 with the same material (e.g., Al) after forming the contact holes shown in FIG. 13.

Figure 16:
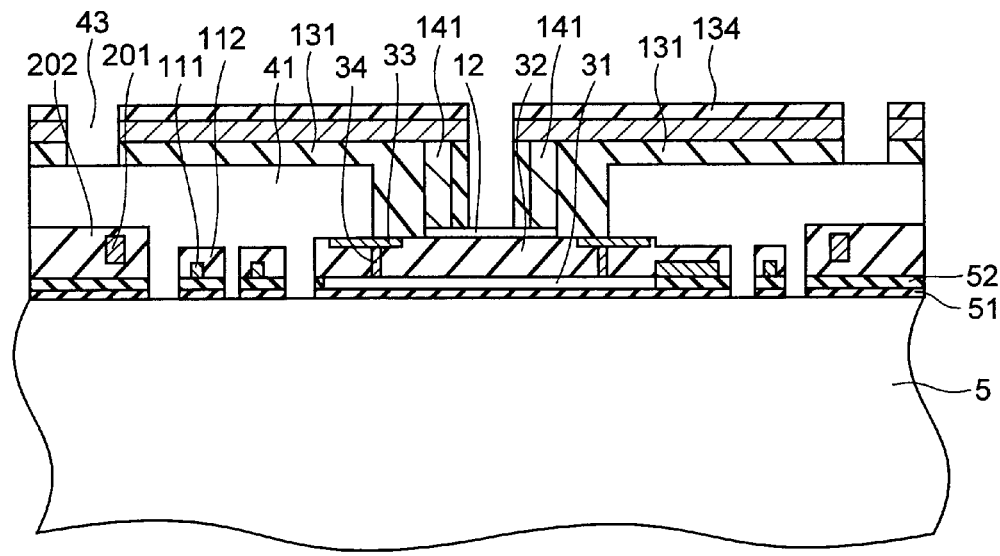

Next, a resist pattern (not shown) is formed on the antenna protective film 134, and the antenna protective film 134, the antenna 142 and the antenna supporting film 131 are patterned by RIE using the resist pattern as a mask (refer to FIG. 16). At this time, the surface of the sacrifice layer 41 is exposed on the bottom of openings 43 formed in the circumference of the patterned antenna 142, and the surface of the resistor 12 is exposed on the bottom of the opening 44 formed in the center of the cell unit 10. Thereafter, the resist pattern is removed.

Figure 17:
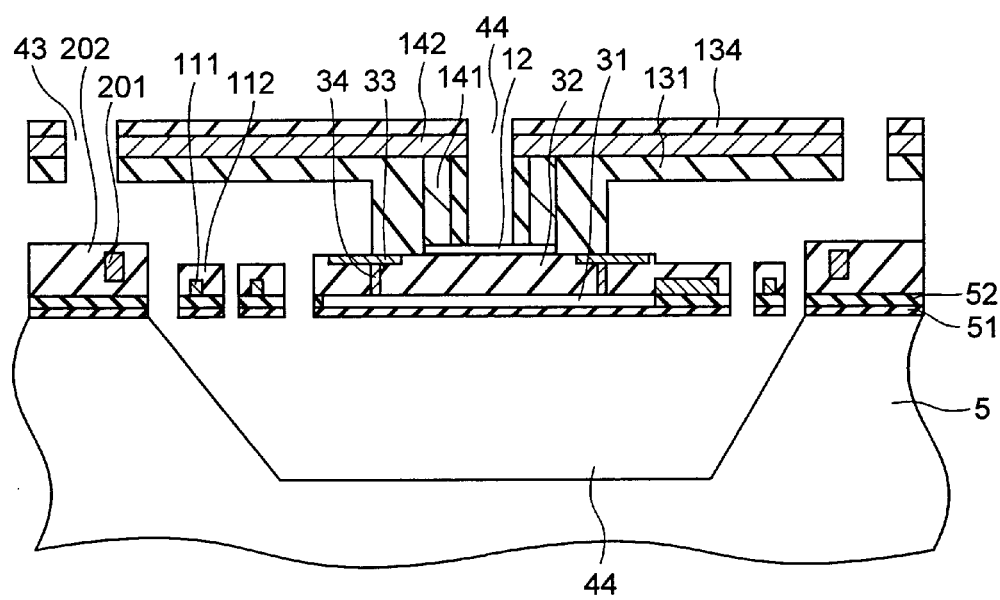

Finally, as FIG. 17 shows, the sacrifice layer 41 and a part of the supporting substrate 5 are removed from the openings 43 using an etchant (anisotropic etchant), such as TMAH (tetramethyl ammonium hydroxide) and KOH. Since such etchants have large etching selectivity depending on the crystal face orientation, under conditions wherein etching does not proceed in (111) orientation (diagonally downward in the drawing), and etching proceeds in (100) orientation (downward in the drawing), only the supporting substrate 5 under the cell unit 10 and the protective film 112 is removed to form the hollow portion 44.

Then, the antenna protective film 134 and the insulating film 32 remaining on the upper portions of the wiring layers 33 are etched by, for example, a buffered-HF treatment to expose the antenna 142 and the upper portions (electric-wave incident surface side) of the wiring layers 33 (FIG. 1).

By the above-described processes, an antenna structure of the present embodiment can be formed on an SOI substrate on which an LSI circuit has been formed.

Figure 27:
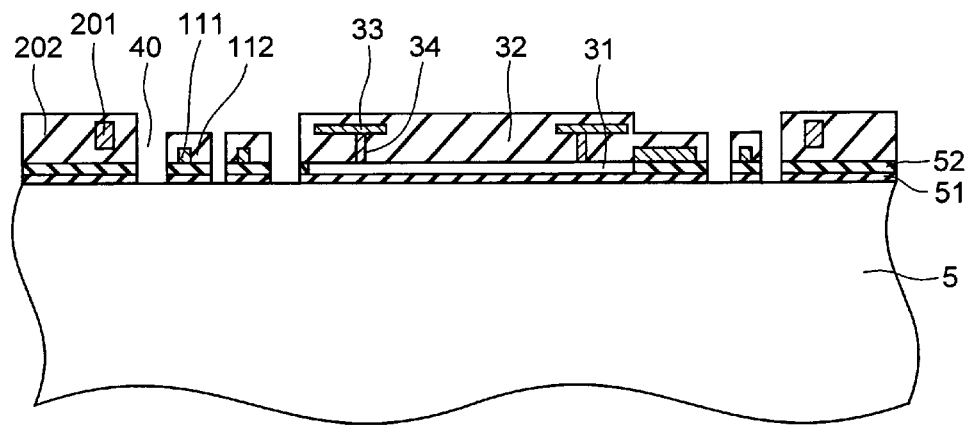
FIGS. 27 and 28 are sectional views illustrating a method for manufacturing a solid-state image sensing device according to another embodiment of the present invention.
Figure 28:
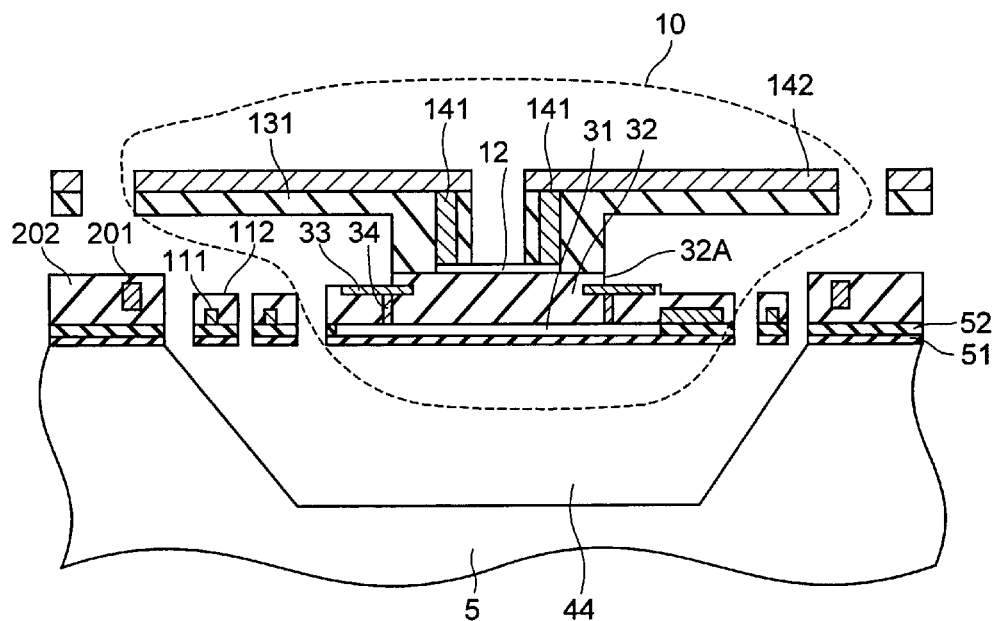

As FIG. 27 shows, when the step shown in FIG. 8 is carried out, only the protective 112 can be etched to leave the insulating film 32 of the cell unit 10, that is the insulating film 32 formed on the wiring layers 33, as it is. In this case, by sequentially carrying out the steps equivalent to the steps shown in FIGS. 9 to 17, a solid-state image sensing device 1 wherein step portions 32A are formed in the vicinity of the upper end corners of the insulating film 32 can be fabricated as shown in FIG. 28. Specifically, by carrying out the step shown in FIG. 17, part of or the entire upper surfaces of the wiring layers 33 are exposed, and the exposed surfaces become the surfaces that reflect infrared lights. According to such a method, by allowing a thin insulating film 32 to remain, the exposure of the wiring layers 33 to etching is prevented in the subsequent step for removing the sacrifice layer 41 and a part of the supporting substrate 5 (FIG. 17), and the thinning or loss of the wiring layers can be prevented.

Figure 18:
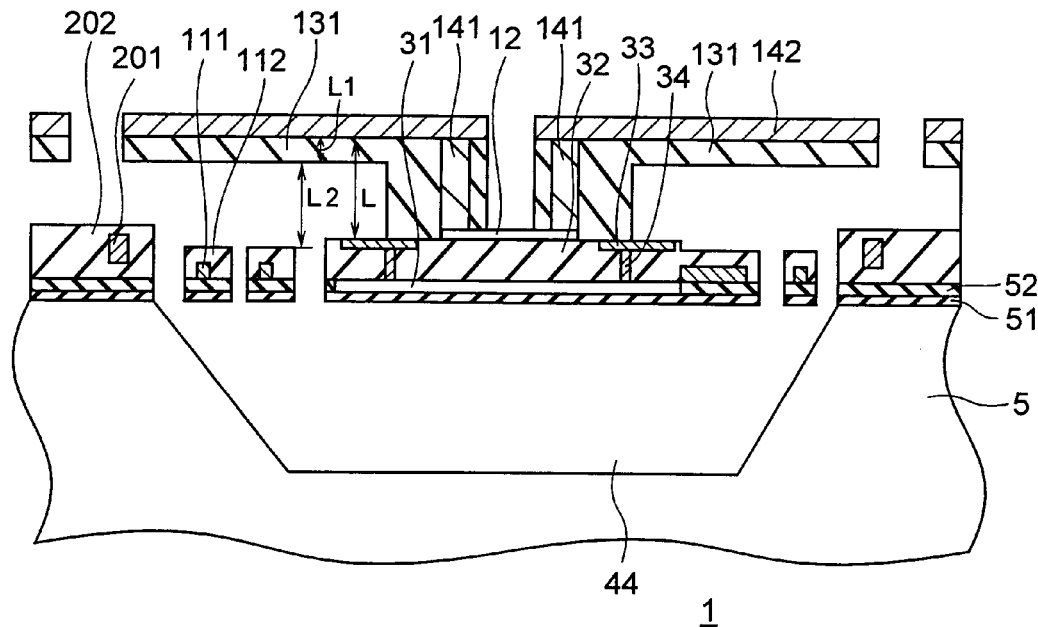
FIG. 18 is a diagram showing the relationship between light path lengths in a solid-state image sensing device according to an embodiment of the present invention.

In the present embodiment, as FIG. 18 shows, by adjusting the light path length "L" between the lower surface of the antenna 142 and the upper surfaces of the wiring layers 33, the absorption of far-infrared lights in such a site can de reduced.

Specifically, for example, when the thickness and the refractive index of the antenna supporting film 131 are represented by "L1" and "$n_1$", respectively, the distance between the lower surface of the antenna supporting film 131 and the upper surface of the wiring layers 33 is represented by "L2", and the refractive index of vacuum is "$n_0$", the light path length "L" between the lower surface of the antenna 142 and the upper surface of the wiring layers 33 is given by the following equation:

$$L = n_1 L1 + n_0 L2 \quad (6)$$

By designing so that the above-described light path length "L" becomes a natural number multiple of the half wavelength λ/2 of the wavelength λ of the light to be reflected, the absorption of the light having the wavelength λ can be reduced.

Normally in infrared sensors, a technique wherein the light path length "L" is made to be a natural number multiple of λ/4, to position the fixed end of the light wave at the upper surface of the wiring layers 33 and the peak of light wave at the site of the antenna supporting film 131, and to improve the absorption by the antenna supporting film 131. Whereas in the present embodiment, by making the valley of the light wave position at the site of the antenna supporting film 131, the absorption is reduced.

Therefore, by designing the above-described light path length "L" to be a natural number multiple of the half wave length of the wavelength band not to be desired to be absorbed, specifically 8 to 12 μm, the absorption of far-infrared lights can be reduced. Actually, "L" can be 4 to 6 μm considering the specifications of the film forming process. As the fabricating process of the cell unit 10 of the present embodiment, "L" can be adjusted in the process for forming the above-described sacrifice layer 41 by controlling the thickness of the sacrifice layer 41.

Specifically, the point is to make the light path length in the region located between the upper surface of the wiring layers 33 and the lower surface of the antenna 142 a natural number multiple of 4 to 6 μm.

Figure 19:
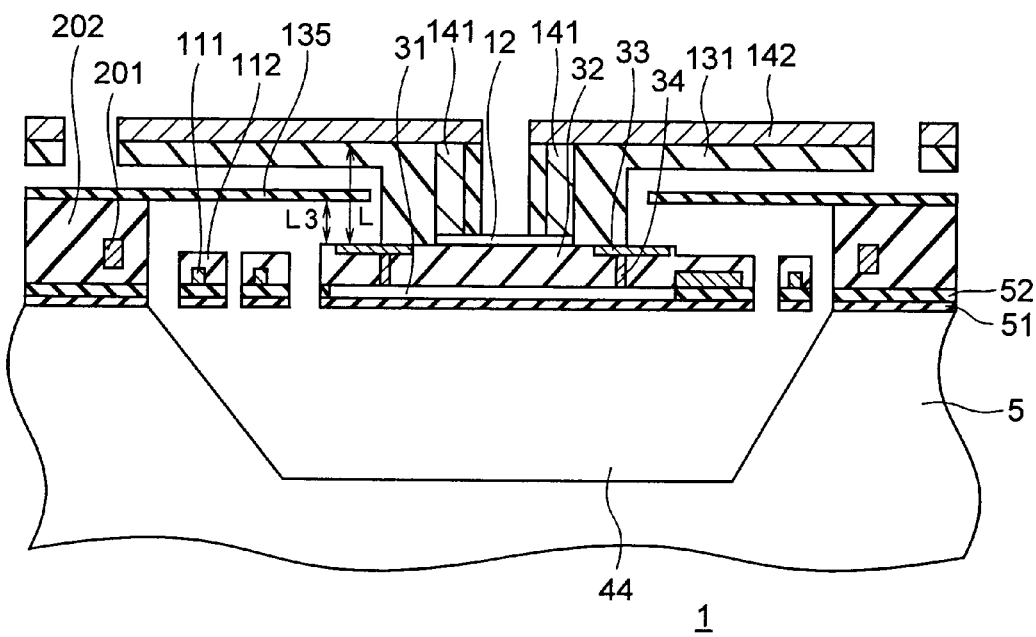
FIG. 19 is a sectional view of a solid-state image sensing device according to another embodiment of the present invention.

Furthermore, as FIG. 19 shows, by forming a far-infrared absorbing film 135 extended from the protective film 202 at the location corresponding to ½ the light path length "L" (the location higher than the upper surfaces of the wiring layers 33 by "L3" (=L/2), the energy of far-infrared lights that have transmitted the antenna 142 can be read out, and released into the protective film 202. The far-infrared absorbing film 135 can be formed of a material that absorbs far-infrared lights, such as $SiO_2$ and SiN.

Figure 20:
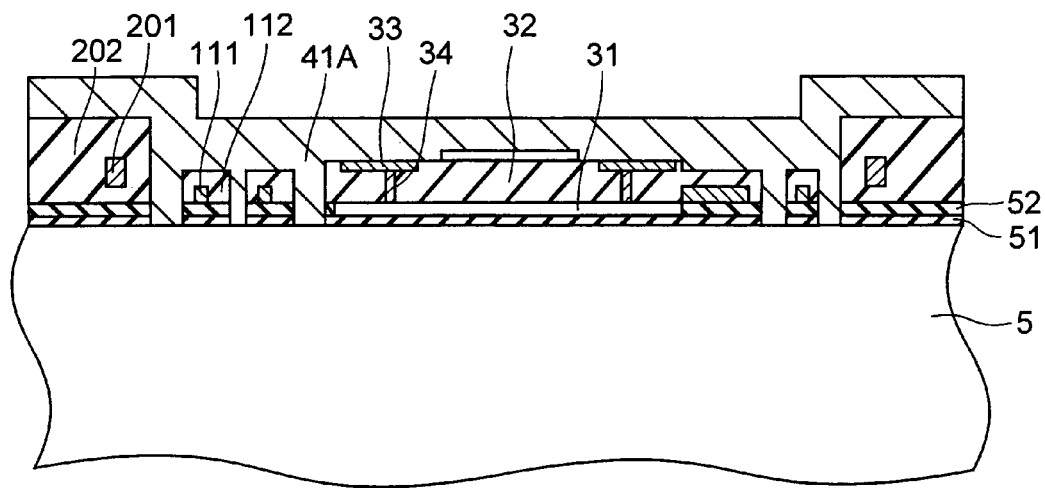
FIGS. 20 to 24 are diagrams showing another example of a method for manufacturing a solid-state image sensing device according to another embodiment of the present invention.

Here, a method for fabricating the far-infrared absorbing film 135 is shown in FIGS. 20 to 24. Although the steps in the fabricating method are identical to the steps shown in FIGS. 6 to 8 in the above-described fabricating method, they are different in that two sacrifice layers must be formed. First, as FIG. 20 shows, a sacrifice layer 41A having a thickness of the above-described L/2 is formed.

Figure 21:
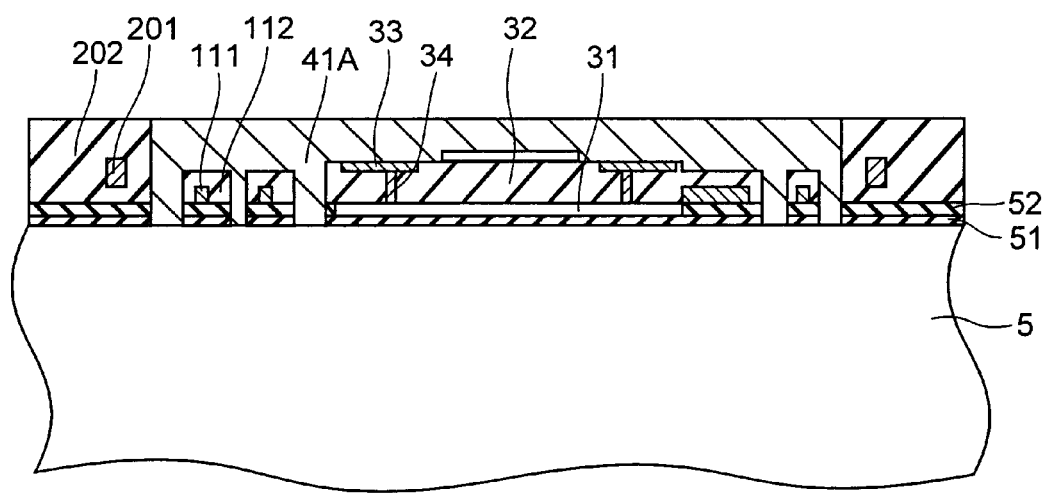
Figure 22:
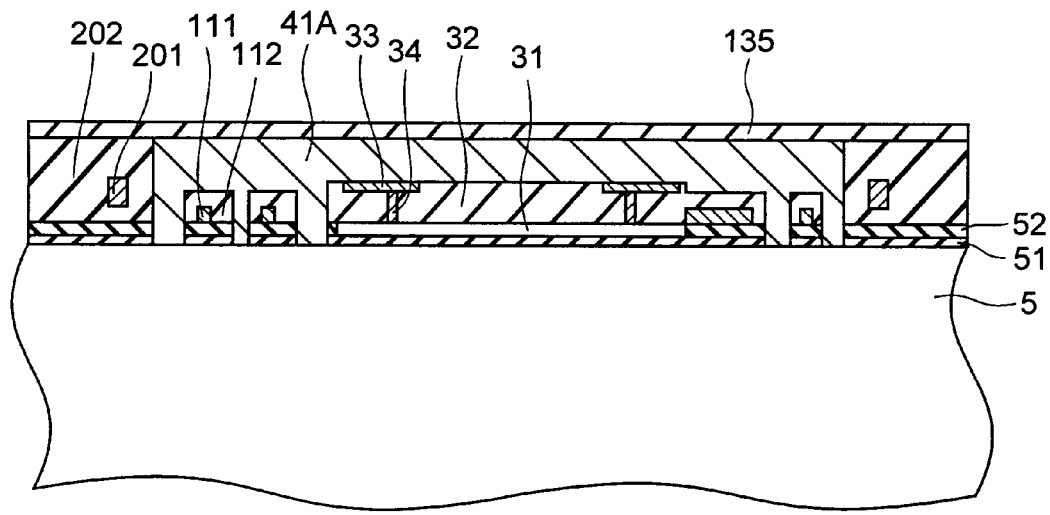

Next, as FIG. 21 shows, the sacrifice layer 41A on the protective film 202 is removed by etching. Then, as FIG. 22 shows, a far-infrared absorbing film 135 is formed on the protective film 202.

Figure 23:
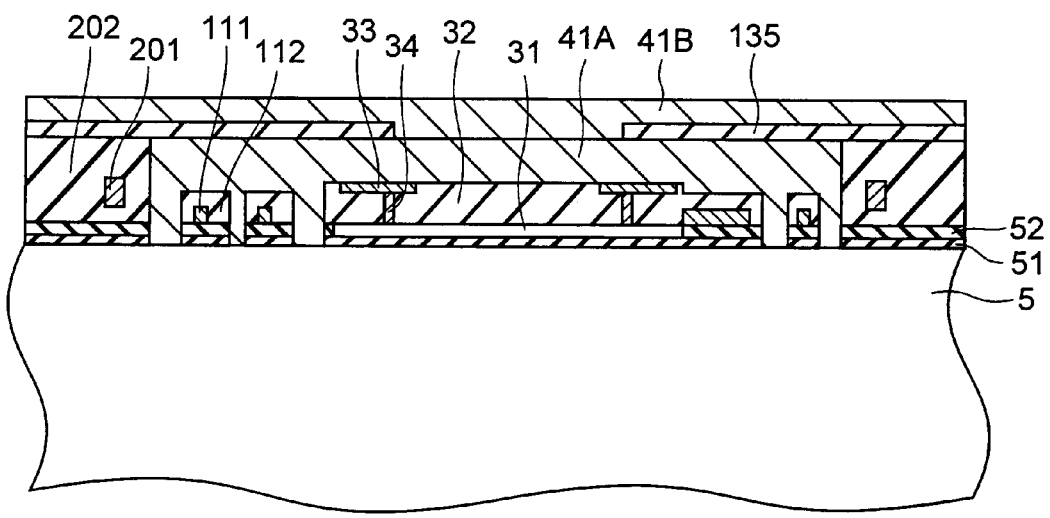
Figure 24:
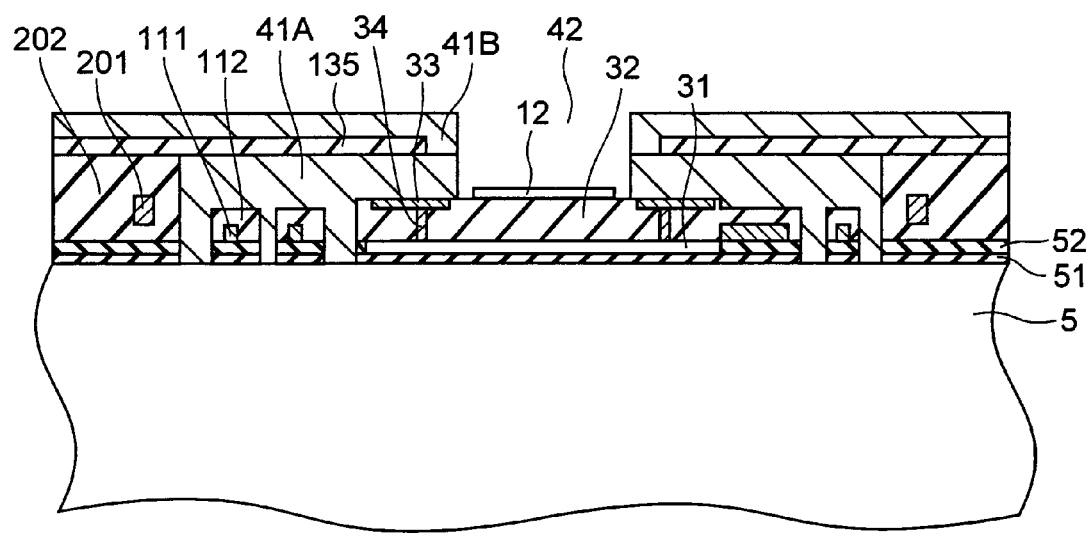

Next, as FIG. 23 shows, the region in the vicinity of the center of the far-infrared absorbing film 135 is etched, and a second sacrifice layer 41B is deposited. Then, in the same manner as the steps shown in FIGS. 10 and 11, an opening 42 is formed, a resistor 12 is formed, and pattering is carried out (FIG. 24). Thereafter, the same steps as the steps shown in FIGS. 12 to 17 are carried out.

Figure 25:
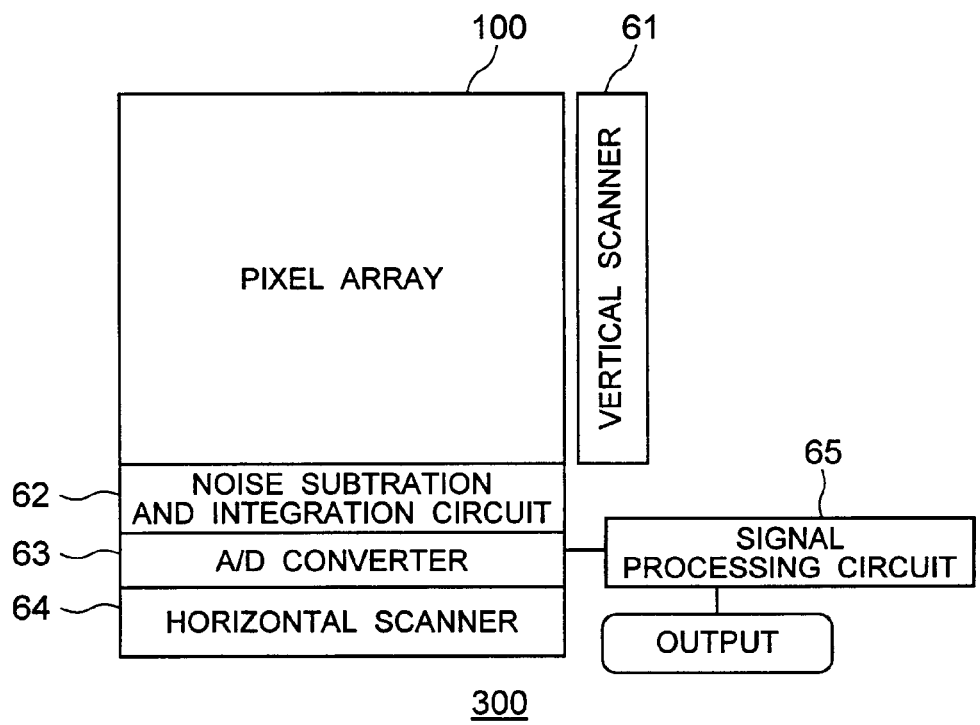
FIG. 25 is a block diagram showing the configuration of an imaging system.

Here, the configuration of an imaging system 300 formed by metrically arranging the above-described solid-state image sensing devices 1 is shown in FIG. 25.

As FIG. 25 shows, the imaging system 300 is composed of a pixel array 100 formed by metrically arranging such solid-state image sensing devices 1, and a readout circuit. The readout, circuit is composed of a vertical scanner 61 that supply a bias voltage row-sequentially to the pixel array 100, a noise subtraction and integration circuit 62 that column-sequentially processes output signals from a solid-state image sensing device 1 located in a selected row, an A/D converter circuit 63, a horizontal scanner 64 that serially read out the signals read out in parallel, and a signal processing circuit 65 that performs an edge detection, a flaw correction, interpolation or the like for the signals read out serially.

Figure 26:
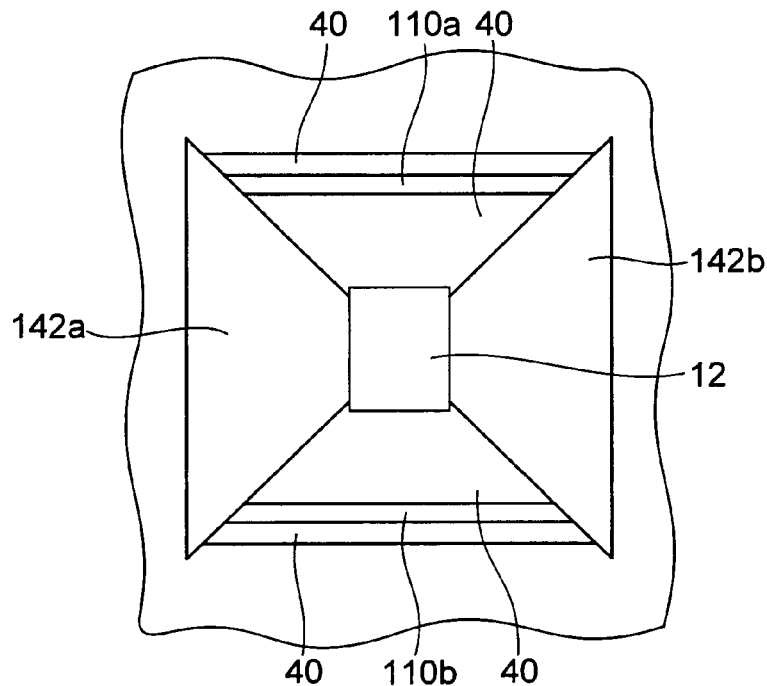
FIG. 26 is a plan view showing a solid-state image sensing device according to another embodiment of the present invention.

The above-described embodiment is only an example, and is not to limit the present invention. For example, as FIG. 26 shows, the insulating film 32 of the cell unit 10 can be formed in the region other than the regions under planar gaps formed by the antenna 142. Specifically, the insulating film 32 is formed under the region where the antenna 142 and the resistor 12 are formed.

In this case, the cell unit 10 is formed so that the surface located in the electric-wave incidental side is covered with the antenna 142 excluding the resistor 12. At this time, if the resistance value of the thermoelectric conversion element 31 can be maintained, various shapes of insulating film 32 can be formed.

Thereby, the degree of freedom in the layout of wiring layers 33 for the planar shape of the antenna 142 can be elevated.

In addition, although the above-described embodiment adopts a configuration wherein the surfaces of the antenna 142, the wiring layers 33, or the resistor 12 are exposed, a configuration wherein a thin silicon dioxide or other insulating film is left on these surfaces can also be used. For example, if an insulating film having a thickness of larger than 0 but not larger than 10 nm is used, the effect to reflect infrared lights can be sufficiently exerted while absorption of infrared lights by the insulating film is sufficiently suppressed.

In this embodiment, although a solid-state image sensing device is formed on an SOI substrate, the solid-state image sensing device can also be formed on a hollowed semiconductor substrate.

In addition, the various modifications of the embodiment can be implemented without departing from the scope of the present invention.

As described above, according to each embodiment of the present invention, the image of long-wavelength light can be converted to electric signals at high sensitivity without cooling and without being affected by the fluctuation of radiated heat of the 10 μm band, and can be outputted as picture or moving images.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

What is claimed is:

1. A solid-state image sensing device comprising:
   a semiconductor substrate having a recess formed in the surface portion thereof;
   a readout wiring portion provided on the semiconductor substrate;
   a support structure portion disposed above the recess, and having a connecting wiring electrically connected to the readout wiring portion; and
   a cell unit disposed above the recess, and supported by the support structure portion, the cell unit comprising:
   an antenna disposed on the surface side receiving incident electric waves in the cell unit, and configured to generate electrical signals by receiving incident electric waves and to reflect infrared lights;
   an electrical resistor electrically connected to the antenna, and configured to vary the temperature of the cell unit by generating Joule heat corresponding to the electrical signals and to reflect the infrared lights;
   a thermoelectric conversion element electrically connected to the support structure portion, electrically insulated from the antenna and the electrical resistor, and thermally connected to the electrical resistor, to generate electrical signals by detecting the temperature variation of the cell unit; and
   a member to reflect infrared lights provided on a surface side receiving the incident electric waves in the cell unit, and configured to be provided on a surface portion not covered by the antenna in the cell unit other than the electrical resistor.

2. The device according to claim 1, wherein
   the antenna has first and second antenna portions that extend in opposite directions to each other, and is disposed on the surface side receiving the incident electric waves in the cell unit; and
   the member to reflect infrared lights is a metal film.

3. The device according to claim 2, wherein
   the metal film comprises a wiring portion electrically connected to the thermoelectric conversion element.

4. The device according to claim 2, wherein
   the light path length of the region sandwiched between the upper surface of the metal film and the lower surface of the antenna is a natural-number times 4 to 6 μm.

5. The device according to claim 4 further comprising
   an infrared absorbing film provided on the location equivalent to about half the light path length of the region sandwiched between the upper surface of the metal film and the lower surface of the antenna overhanging from the readout wiring portion.

6. The device according to claim 1, wherein
   the member to reflect infrared lights is a metal film,
   the thermoelectric conversion element comprises at least two pn-junction diodes serially connected, and
   the metal film comprises a wiring portion to connect between the pn-junction diodes.

7. The device according to claim 1, wherein
   the surface of the cell unit located on the side receiving the incident electric waves is covered with the antenna excluding the electrical resistor.

8. The device according to claim 1, wherein
   the thermoelectric conversion element comprises at least two pn-junction diodes serially connected, and generates electrical signals corresponding to the temperature variation of the cell unit by supplying a forward bias voltage to the pn-junction diode via the support structure wiring portion to flow a constant current, and detecting change in the potential difference between the both sides of the thermoelectric conversion element generated by receiving the electric wave.

9. An imaging system comprising:

a semiconductor substrate having a recess formed in a surface portion thereof a plurality of solid-state image sensing devices disposed in a matrix form on the semiconductor substrate as a pixel array, each of the solid-state image sensing devices comprising:

a readout wiring portion provided on the semiconductor substrate;

a support structure portion disposed above the recess, and having a connecting wiring electrically connected to the readout wiring portion, and a cell unit disposed above the recess, and supported by the support structure portion, the cell unit comprising:

an antenna disposed on the surface side receiving incident electric waves in the cell unit, and configured to generate electrical signals by receiving incident electric waves and to reflect infrared lights, an electrical resistor electrically connected to the antenna, and configured to vary the temperature of the cell unit by generating Joule heat corresponding to the electrical signals and to reflect the infrared lights, a thermoelectric conversion element electrically connected to the support structure portion, electrically insulated from the antenna and the electrical resistor, and thermally connected to the electrical resistor, to generate electrical signals by detecting the temperature variation of the cell unit, and a member to reflect infrared lights provided on the incident side of the electric waves in the cell unit, and configured to be provided on a surface portion not covered by the antenna in the cell unit other than the electrical resistor; and a readout circuit that sequentially reads out the electrical signals sensed by each of the solid-state image sensing devices as picture signals.

10. The system according to claim 9, wherein the antenna has first and second antenna portions that extend in opposite directions to each other, and is disposed on the surface side receiving the incident electric waves in the cell unit; and the member to reflect infrared lights is a metal film.

11. The system according to claim 10, wherein the metal film comprises a wiring portion electrically connected to the thermoelectric conversion element.

12. The system according to claim 10, wherein the light path length of the region sandwiched between the upper surface of the metal film and the lower surface of the antenna is a natural-number times 4 to 6 μm.

13. The system according to claim 12 further comprising an infrared absorbing film provided on the location equivalent to about half the light path length of the region sandwiched between the upper surface of the metal film and the lower surface of the antenna overhanging from the readout wiring portion.

14. The system according to claim 9, wherein the member to reflect infrared lights is a metal film, the thermoelectric conversion element comprises at least two pn-junction diodes serially connected, and the metal film comprises a wiring portion to connect between the pn-junction diodes.

15. The system according to claim 9, wherein the surface of the cell unit located on the side receiving the incident electric waves is covered with the antenna excluding the electrical resistor.

16. The system according to claim 9, wherein the thermoelectric conversion element comprises at least two pn-junction diodes serially connected, and generates electrical signals corresponding to the temperature variation of the cell unit by supplying a forward bias voltage to the pn-junction diode via the support structure wiring portion to flow a constant current, and detecting change in the potential difference between the both sides of the thermoelectric conversion element generated by receiving the electric wave.

* * * * *